United States Patent [19]

Andrews

[11] Patent Number: 5,231,314
[45] Date of Patent: Jul. 27, 1993

[54] PROGRAMMABLE TIMING CIRCUIT FOR INTEGRATED CIRCUIT DEVICE WITH TEST ACCESS PORT

[75] Inventor: John R. Andrews, Saco, Me.

[73] Assignee: National Semiconductor Corporation, Santa Clara, Calif.

[21] Appl. No.: 845,387

[22] Filed: Mar. 2, 1992

[51] Int. Cl.$^5$ .................... H03K 19/00; H04B 17/00
[52] U.S. Cl. ................................ 307/480; 371/22.1; 371/22.2; 324/158 R
[58] Field of Search .............................. 307/480, 443; 371/22.1–22.3, 22.6; 324/158 R

[56] References Cited

U.S. PATENT DOCUMENTS

| | | | |
|---|---|---|---|
| 4,876,519 | 1/1989 | Davis | 331/57 |
| 5,013,944 | 5/1991 | Fischer et al. | 307/603 |
| 5,029,166 | 7/1991 | Jarwala et al. | 371/22.1 |
| 5,109,190 | 4/1992 | Sakashita et al. | 324/158 R |
| 5,132,635 | 7/1992 | Kennedy | 371/22.3 |
| 5,132,685 | 7/1992 | DeWitt et al. | 324/73.1 |
| 5,150,044 | 9/1992 | Hashizume et al. | 324/158 X |
| 5,155,732 | 10/1992 | Jarwala et al. | 371/22.3 |

OTHER PUBLICATIONS

IEEE Standard Test Access Port and Boundary Scan Architecture, Test Technology Technical Committee of the IEEE Computer Society (May 21, 1990).
The Test Access Port and Boundary Scan Architecture, IEEE Computer Society Press (IEEE 1990), Colin M. Maunder & Rodham E. Tulloss.
"IEEE Standard Boundary Scan 1149.1" John Andrews.
"A Step by Step Guide to Programmable Delays", Electronic Design, pp. 97–104 Jun. 13, 1991, Feldman & Rosky.
"A Variable Delay Line PLL For CPU-Coprocessor Synchronization", IEEE Journal of Solid State Circuits, vol. 23, No. 5, pp. 1218–1223 Oct., 1988.
"A 33 Mb/5 Data Synchronizing Phase Locked Loop Circuit", Llewellyn, Wong, et al., 1988 IEEE International Solid States Circuits Conference, Digest of Technical Papers, Feb. 17, 1988 (WAM1.1).

*Primary Examiner*—Edward P. Westin
*Assistant Examiner*—Andrew Sanders
*Attorney, Agent, or Firm*—Daniel H. Kane; James W. Rose; Richard C. Calderwood

[57] ABSTRACT

A programmable and controllable timing circuit (CTC) is formed on an integrated circuit chip (IC) having a test access port (TAP) with TAP access pins including a TAP data input (TDI) pin, a TAP data output (TDO) pin, a TAP mode select (TMS) pin, and a TAP clock (TCK) pin. The test access port includes a plurality of TAP data registers (TDRs) coupled to receive data signals at the TDI pin and to shift data signals to the TDO pin. A TAP instruction register (TIR) is coupled to receive instruction codes at the TDI pin and to direct use of selected TDRs. A TAP controller is coupled to receive control signals at the TMS pin and clock signals at the TCK pin and provide control and clock signals for controlling operation of the TIR and TDRs. The TAP is provided with a controllable timing circuit design specific TAP data register (CTC/DS/TDR) constructed for receiving a coded CTC digital timing code at the TDI pin. A variable timing generator circuit on the IC is responsive to a CTC digital timing code for generating a selected time interval between a start trigger signal (STS) and a clock strobe signal (STB) according to the specified CTC digital timing code. The CTC/DS/TDR is coupled to the variable timing generator circuit for specifying a selected time interval. In the preferred example the variable timing generator circuit is provided by a ramp generator (RAMP) initiating a voltage ramp signal (V$_{RAMP}$) in response to an STS, a digital to analog converter (DAC) coupled to the CTC/DS/TDR for delivering an analog CTC voltage level signal (V$_{CTC}$), and a comparator (COMP) coupled to receive and compare the voltage ramp signal (V$_{RAMP}$) and CTC voltage signal (V$_{CTC}$) and to deliver the clock strobe signal (STB)

20 Claims, 9 Drawing Sheets

PROGRAMMABLE TIMING CIRCUIT FOR INTEGRATED CIRCUIT DEVICE WITH TEST ACCESS PORT

TECHNICAL FIELD

This invention relates to a new controllable and programmable timing circuit for IC devices having a standard test access port (TAP) of the type specified in IEEE Standard 1149.1 Test Access Port and Boundary Scan Architecture and in the protocol of the Joint Test Action Group JTAG Version 2.0. The TAP is constructed with a controllable timing circuit (CTC) design specific test access port data register (TDR) to receive a CTC digital timing code applied at the TAP test data input (TDI) pin. A variable timing generator circuit on the IC device is responsive to a CTC digital timing code from CTC design specific TDR for generating a selected time interval according to the specified CTC digital timing code received through the test access port.

BACKGROUND ART

The calibration and tuning of system timing provided by a system timing generator circuit is a critical factor in system performance including memory performance. Increasing clock frequencies require less skew between related signals while timing measurement becomes more difficult. Both factory calibration and field tuning may be unsatisfactory for a subsequent user. Inexperienced technicians may also misadjust timing during factory or field tuning.

Failure of system timing is also due to the use of discrete wire wound delay line components packaged in separate dual-in-line packages (DIPs). Such discrete delay lines are unreliable and a major cause of system failure. Other timing calibration tools such as monostable multi-vibrators and decoded counters suffer from drift and low resolution.

The present invention seeks to provide an integrated circuit replacement for discrete delay lines using a programmable and controllable variable timing generator circuit formed directly on the integrated circuit chip device. According to the invention access to the new integrated circuit programmable timing generator circuit is obtained through a standard test access port (TAP) such as the IEEE Standard 1149.1 Test Access Port and Boundary Scan Architecture and the JTAG Version 2.0 Protocol for a Test Access Port. The present invention is therefore applicable to IC devices with a test access port of the type illustrated in FIGS. 1-4.

The test access port (TAP) defined by IEEE Standard 1149.1 Test Access Port and JTAG Version 2.0 for incorporation on an integrated circuit chip is illustrated in FIG. 1. At least four pins of the IC device and up to 3% to 25% of the chip silicon surface area is dedicated to the test access port and associated TAP circuits. The TAP is intended to standardize and facilitate boundary scan testing and other design specific testing of the IC device while the chip is still mounted on a circuit board and without separate test instrumentation. The TAP permits all phases of testing with access at all pins of the IC device through boundary scan principles even for surface mount devices and without the necessity of "bed of nails" physical contact. Access to all pins for testing is achieved electronically through the boundary scan shift register, one of the test data registers of the test access port.

The dedicated pins for the test access port include a test data input (TDI) pin to receive data signals for the test data registers (TDRs) and to receive instruction codes for the test instruction register TIR. The test data output (TDO) pin shifts out data signals from the TDRs and instruction codes from the TIR for example for input to the TDI pin of the next IC device on a circuit board. Data signals and instruction codes are shifted out from the TDRs and TIR to the TDO pin through respective multiplexers MUX, a latch or passgate, and an output buffer coupled to the TDO pin.

The remaining two required pins of the standard TAP are a test mode select (TMS) pin and a test clock (TCK) pin which provide respective control and clock signals to the TAP controller which in turn directs operation of the test access port. In response to TMS control signals and TCK clock signals, the TAP controller selects either the instruction register TIR for entry of an instruction code from the TDI pin, or selects a test data register TDR for entry of data signals from the TDI pin. According to the selected mode of operation, for example a test to be performed or a design specific procedure to be followed, the appropriate instruction code is shifted into the instruction register TIR. The instruction code is decoded by instruction decode register IDR and the TIR selects one or more of the TAP test data registers TDRs required for the selected test or procedure.

The minimum required TDRs include the boundary scan register TDR1 for performing boundary scan testing and the bypass register TDR2 for bypassing data signals and instruction codes to the TDO pin in order to bypass a particular chip for a selected test or other procedure. The TAP may also include design specific TDRs such as TDR4 illustrated in FIG. 1 for performing a customized or design specific procedure as hereafter described. An optional TAP test reset pin or TRST pin may be dedicated for resetting the TAP controller.

The central operating feature of the standard TAP is the boundary scan register TDR1 shown in more detail in FIG. 2. The boundary scan register TDR1 is a shift register of series coupled boundary scan cells BSC. A boundary scan cell BSC is coupled at each pin of the IC device in the system logic path between the respective input or output pin and the IC device internal system logic. Under appropriate program control, data signals may be shifted into position through the boundary scan path of the boundary scan register for example for input to the IC device system logic through the input pins. The processed data signals may be latched at the boundary scan cells adjacent to output pins to be shifted out through the boundary scan path and TDO pin for test analysis. Each boundary scan cell BSC generally incorporates two flip-flops and two multiplexers for accomplishing these boundary scan test objectives. The boundary scan register and boundary scan test principles permit access to all pins of the IC device without physical contact by a "bed of nails" testing apparatus.

A more detailed fragmentary block diagram of the test access port data registers TDRs is illustrated in FIG. 3. FIG. 3 shows a bank of TDRs including the minimum required boundary scan register TDR1 and bypass register TDR2. An optional test data register is the device identification register TDR3 for coded identification of a device name. Additionally there may be a plurality of specialized design specific TAP data registers TDR4, TDR5 and TDRN etc. for design specific tests or procedures.

A state diagram showing the operation of the TAP controller for a standardized test access port is illustrated in FIG. 4. From the Run Test/Idle condition, the TAP controller selects either the TAP test instruction register TIR or one of the TAP test data registers TDRs for shifting respective instruction codes or data signals into and from the captured register TDRN between the TDI and TDO pins. Further background information and detailed instruction on the construction and operation of standardized test access ports are found in the following references: *IEEE STANDARD TEST ACCESS PORT AND BOUNDARY SCAN ARCHITECTURE*, Test Technology Technical Committee of the IEEE Computer Society, Institute of Electrical and Electronics Engineers, Inc., 345 East 47th Street, New York, N.Y. 10017 U.S.A. (May 21, 1990) (IEEE Standard 1149.1-1990); Colin M. Maunder and Rodham E. Tulloss, *THE TEST ACCESS PORT AND BOUNDARY SCAN ARCHITECTURE*, IEEE Computer Society Press Tutorial, IEEE Computer Society Press, 10662 Los Vaqueros Circle, P.O. Box 3014, Los Alamitos, Calif. 90720-1264 (IEEE 1990); John Andrews, "IEEE Standard Boundary Scan 1149.1", National Semiconductor Corporation, 333 Western Avenue, South Portland, Me. 04106, WESCON, San Francisco, 1991.

As noted by Maunder and Tulloss, the design specific TAP test data registers TDRs can be part of the on-chip system logic or the test logic and can have both system and test functions. The dedicated test access port pins afford convenient access to the chip for example from a portable computer at an external location for testing or otherwise servicing the IC device in situ in its operating circuit board and environment.

According to the terminology adopted in this specification, the reference to "test" components and elements of the TAP is generalized to "TAP" components and elements to encompass both test logic functions and system logic functions for which the TAP might be used. Thus, the standard test data input pin, test data output pin, test mode select pin, test clock pin, test data registers, and test instruction register etc. are referred to herein more generally as TAP data input (TDI) pin, TAP data output (TDO) pin, TAP mode select (TMS) pin, TAP clock (TCK) pin, TAP data registers (TDRs), and TAP instruction register (TIR) etc. This more generalized terminology is appropriate to objects and features of the present invention implementing the TAP components and elements in system logic functions.

OBJECTS OF THE INVENTION

It is an object of the present invention to provide a new controllable and programmable timing generator circuit for IC devices constructed with such a standard test access port (TAP).

Another object of the invention is to provide an on chip timing generator circuit controllable and programmable through the test access port in response to a digital timing code for generating a selected time interval between a start trigger signal and a clock strobe signal according to the digital timing code.

A further object of the invention is to provide an IC device with a test access port having a controllable timing circuit design specific TAP data register for receiving a digital timing code to program an on chip variable timing generator circuit to generate the selected time interval.

DISCLOSURE OF THE INVENTION

In order to accomplish these results the invention provides a controllable timing circuit for an integrated circuit chip and a test access port (TAP) with a controllable timing circuit design specific TAP data register (CTC/DS/TDR) constructed for receiving a coded CTC digital timing code at the TDI pin. A variable timing generator circuit is responsive to the CTC digital timing code for generating a selected time interval between a start trigger signal (STS) and a clock strobe signal (STB) according to the specified CTC digital timing code. The CTC/DS/TDR is coupled to the variable timing generator circuit for specifying the selected time interval between the STS and STB.

In the preferred example embodiment, the timing generator circuit is provided by a ramp generator having a start trigger signal input for initiating a voltage ramp signal (RAMP) at a ramp generator output in response to an STS. The input of a digital to analog converter is coupled to the CTC/DS/TDR and an output delivers an analog CTC voltage level signal corresponding to the specified CTC digital timing code. A comparator has first and second inputs coupled to receive and compare the respective voltage ramp signal and CTC voltage signal. The comparator output delivers a clock strobe signal (STB) upon substantial coincidence of the voltage ramp signal and CTC voltage level signal.

According to one example an STS pin is coupled to the STS input of the ramp generator for applying an off chip start trigger signal (STS) to initiate the ramp voltage signal RAMP. An STB pin is coupled to the output of the comparator for delivering a clock strobe signal a selected time interval after the STS for off chip use. In the preferred example an off chip non-volatile CTC timing code memory is coupled to the TDI pin. The off chip CTC timing code memory stores at least one CTC digital timing code for entry into the CTC/DS/TDR through the TDI pin for specifying the selected time interval. Similarly, an off chip CTC control processor provides the CTC instruction code through the TDI pin to the TAP instruction register for controlling transfer of timing code data.

According to an alternative embodiment the timing generator circuit is provided by a selectable path delay circuit having a delay circuit input, delay circuit output, and a plurality of alternative delay paths between the delay circuit input and output. The alternative delay paths afford different time intervals between a start trigger signal (STS) applied at the delay circuit input and a clock strobe signal (STB) delivered at the delay circuit output. A plurality of E$^2$PROM memories are coupled respectively in parallel between the respective delay paths and the delay circuit output. The E$^2$PROM memories are coupled to the CTC/DS/TDR to select a respective delay path and corresponding time interval in response to a specified CTC digital timing code.

The invention also provides a new method of controlling and programming the timing of the controllable timing circuit on an integrated circuit chip using the test access port. Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
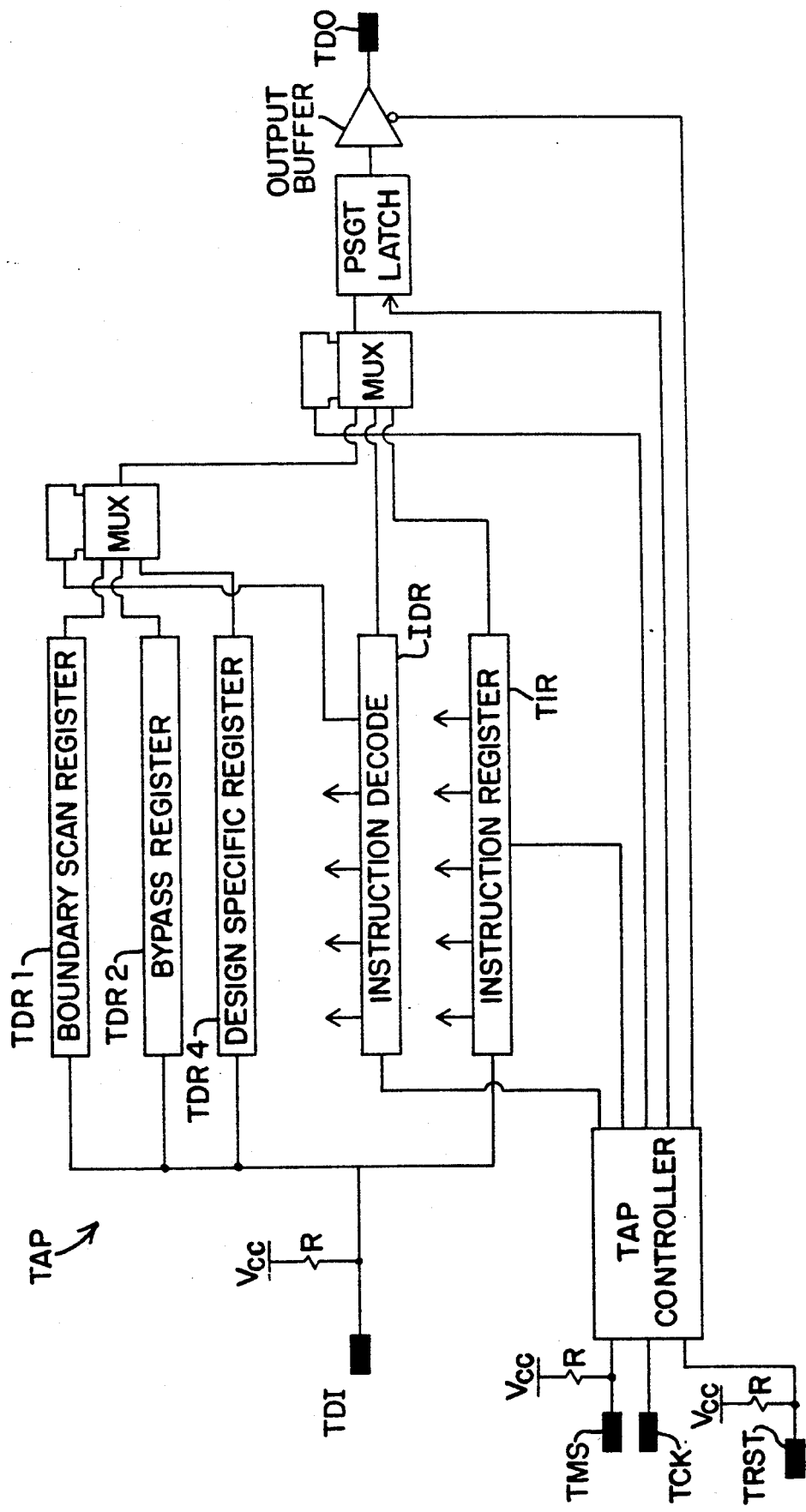
FIG. 1 is a general block diagram of a standard test access port following IEEE Standard 1149.1 and JTAG Version 2.0.
Figure 2:
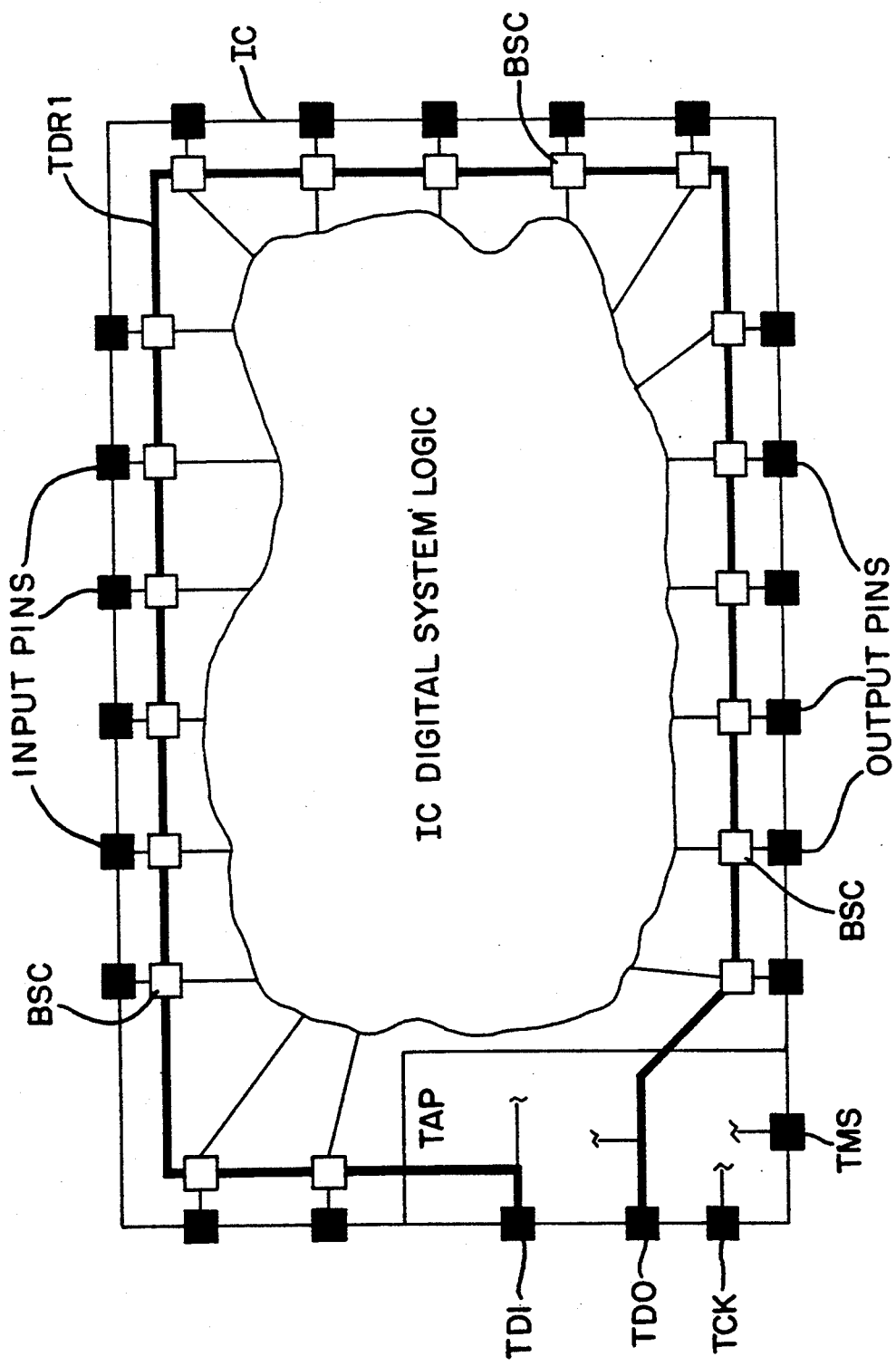
FIG. 2 is a simplified block diagram of the boundary scan register TDRI of the test access port of FIG. I.
Figure 3:
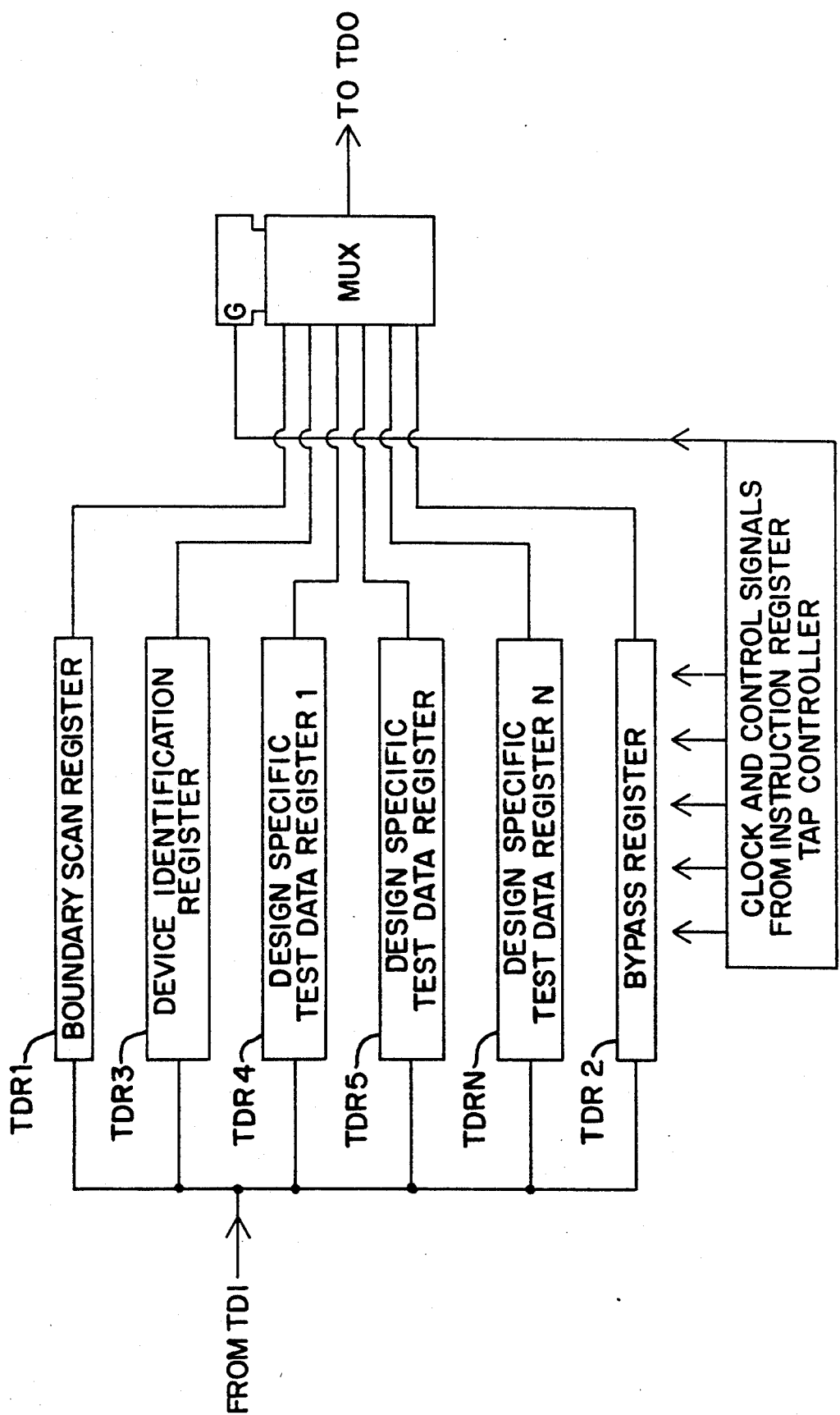
FIG. 3 is a detailed block diagram of the TAP data registers TDRs for a test access port of the type illustrated in FIG. 1.
Figure 4:
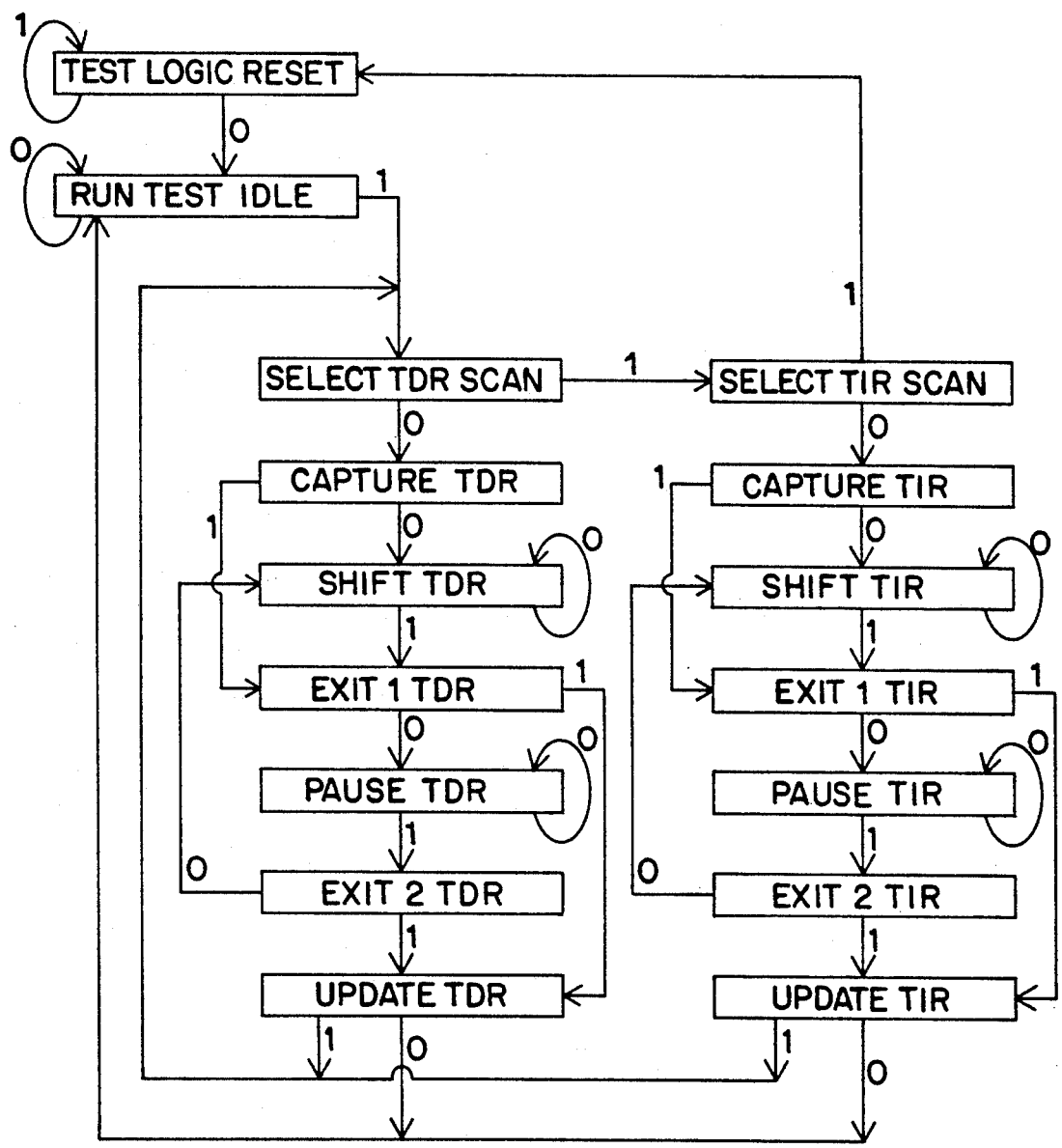
FIG. 4 is a state diagram showing operation of the test access port.
Figure 5:
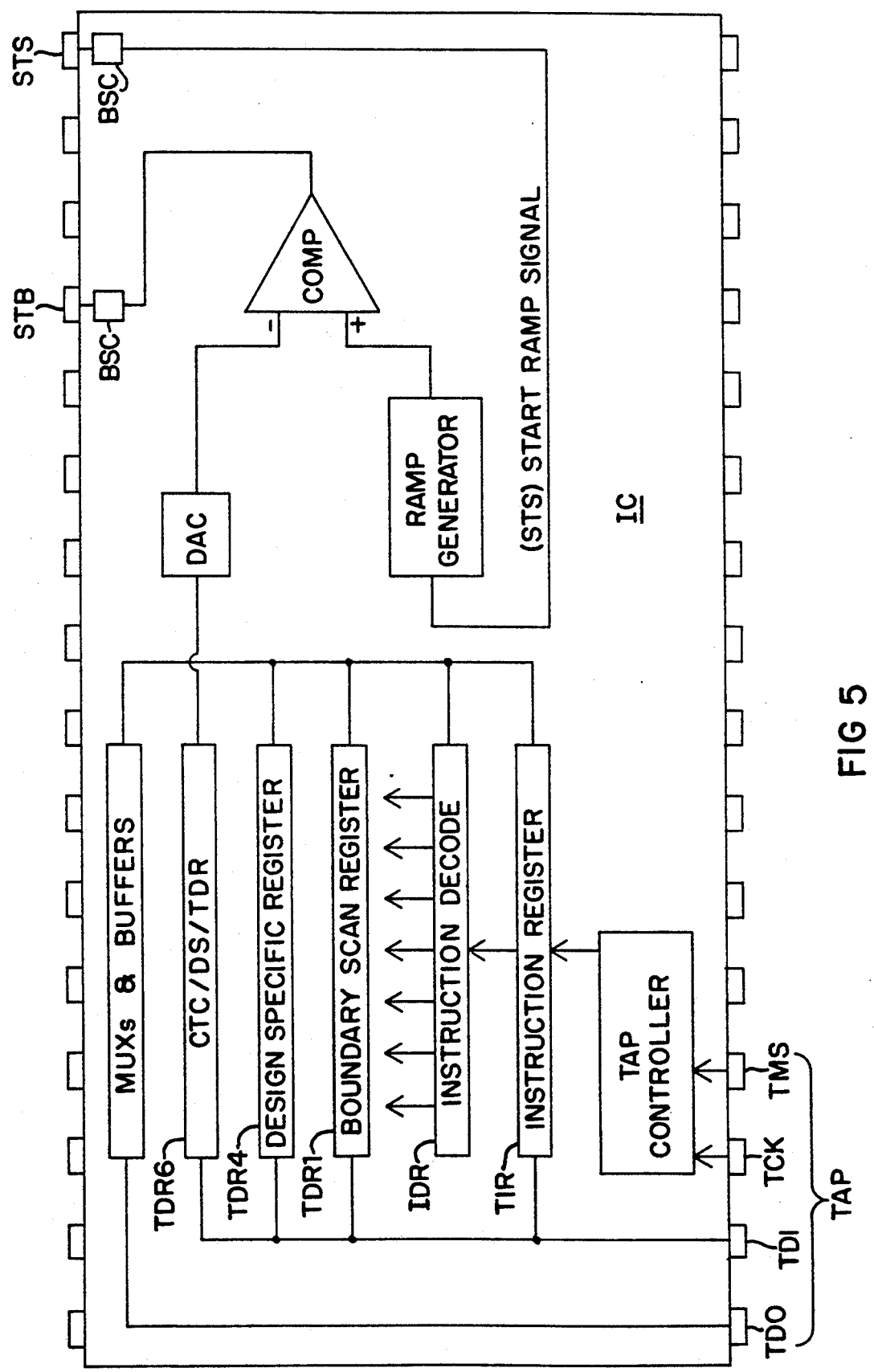
FIG. 5 is a block diagram of the programmable and controllable timing circuit according to the invention.

A simplified circuit diagram of an integrated circuit chip IC incorporating the programmable and controllable timing circuit according to the invention is illustrated in FIG. 5. The IC device incorporates a standard test access port as described with reference to FIGS. 1-4 and elements performing the same functions are indicated by the same reference designations. For simplicity, the boundary scan cells BSC of the boundary scan register TDRI are not shown on the IC chip block diagram except at the STS input pin and STB output pin.

The test access port TAP of the IC device of FIG. 5 incorporates as one of the design specific registers a controllable timing circuit design specific TAP data register TDR6 referred to herein as CTC/DS/TDR. In this example the controllable timing circuit design specific TAP data register TDR6 is an 8 bit shift register coupled to the TDI pin for receiving an 8 bit wide CTC digital timing code. Different length shift registers and different length timing codes may of course also be used. The CTC/DS/TDR is therefore capable of receiving and temporarily storing any of 256 different CTC digital timing codes, for specifying up to 256 different timing intervals as hereafter described. The output of the CTC/DS/TDR is coupled to a digital to analog converter DAC which converts the 256 digital timing codes into 256 respective graduated analog voltage levels at the output of the DAC. The analog voltage signal level at the output of the DAC is referred to herein as $V_{CTC}$.

Figure 6:
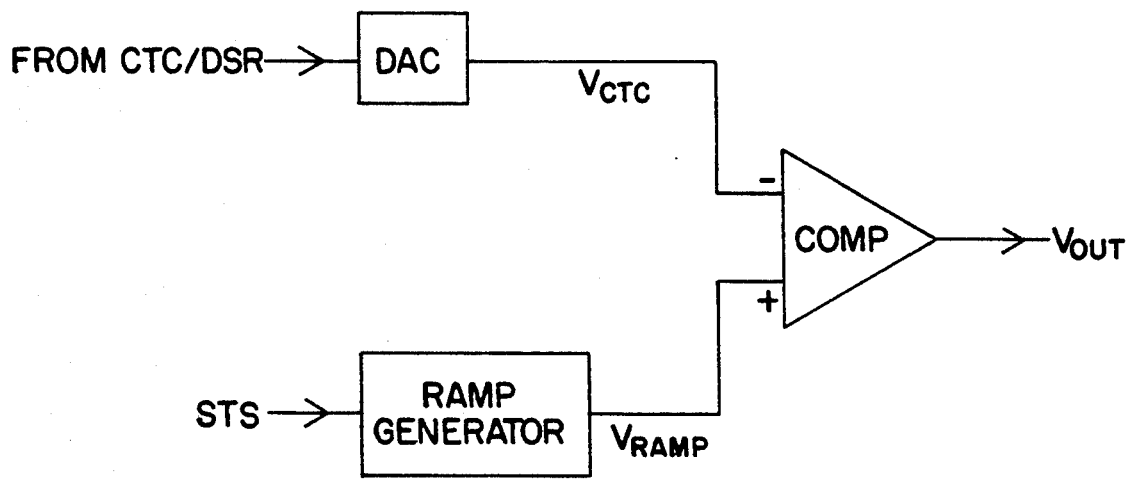
FIG. 6 is a detailed block diagram of the preferred example ramp generator and comparator timing generator circuit embodiment of the invention.

The DAC and its output voltage signal $V_{CTC}$ form part of a variable timing generator circuit based on an analog variable ramp and comparator timing circuit shown separately in FIG. 6. The analog variable timing generator circuit incorporates a ramp generator RAMP which delivers at the ramp generator output a stable ramp or sawtooth voltage signal $V_{RAMP}$ as shown in the timing diagram of FIG. 7. The ramp voltage signal output $V_{RAMP}$ is initiated by a start trigger signal STS applied at the STS pin of the IC device and the STS input of the ramp generator RAMP.

The respective voltage signals $V_{CTC}$ and $V_{RAMP}$ from the DAC and ramp generator RAMP are applied at the first and second inputs of a voltage comparator COMP. The output of the voltage comparator provides the desired clock strobe signal STB a selected time interval after the start trigger signal STS.

Figure 7:
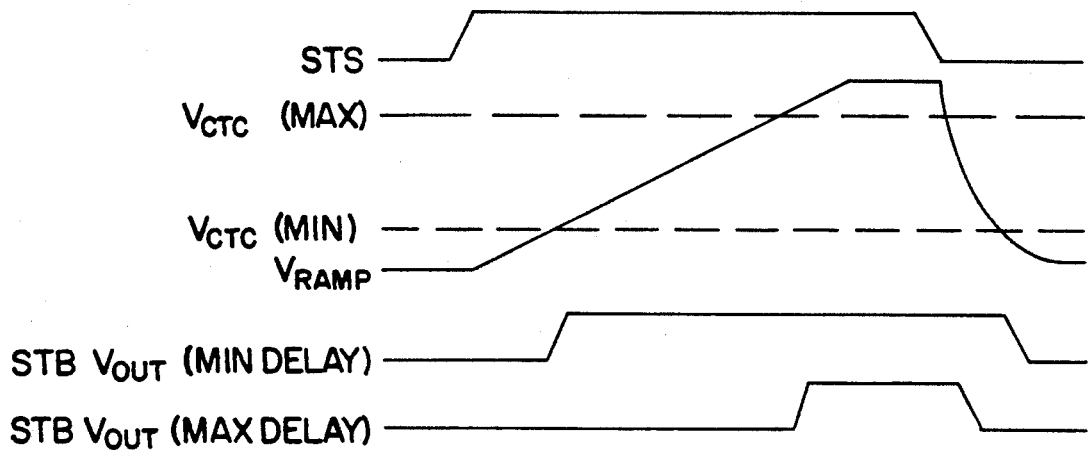
FIG. 7 is a timing diagram for the operation of the timing generator of FIGS. 5 and 6.

Referring to the timing diagram of FIG. 7, $V_{CTC}$ (min) and $V_{CTC}$ (max) represent the minimum and maximum analog voltage levels of the possible 256 graduated voltage levels at the output of the DAC that may be specified by the 256 possible CTC binary timing codes from the cTc/Ds/TDR. Other length timing codes affording greater or lesser levels of resolution may of course also be used. Following initiation of the ramp voltage signal $V_{RAMP}$ by the start trigger signal STS, substantial coincidence between the voltage signals $V_{CTC}$ and $V_{RAMP}$ will cause a rising edge clock strobe signal STB at the output of the comparator COMP and the STB pin. As shown in FIG. 7 the STB $V_{OUT}$ (min delay) represents the minimum time delay or insertion delay achievable by the analog variable timing generator circuit when the ramp voltage signal ($V_{RAMP}$) coincides with the lowest analog voltage signal level $V_{CTC}$ (min) at the output of the DAC. The rising edge of the clock strobe signal STB $V_{OUT}$ (max delay) represents the longest time interval between the STS and STB in the range of the analog variable timing generator circuit when the ramp voltage signal $V_{RAMP}$ coincides with the highest voltage level $V_{CTC}$ (max) at the output of the DAC. The difference between the longest time interval between STS and STB and the shortest time interval between STS and STB represents the programmable range and resolution of the ramp and comparator variable timing generator circuit.

Figure 8:
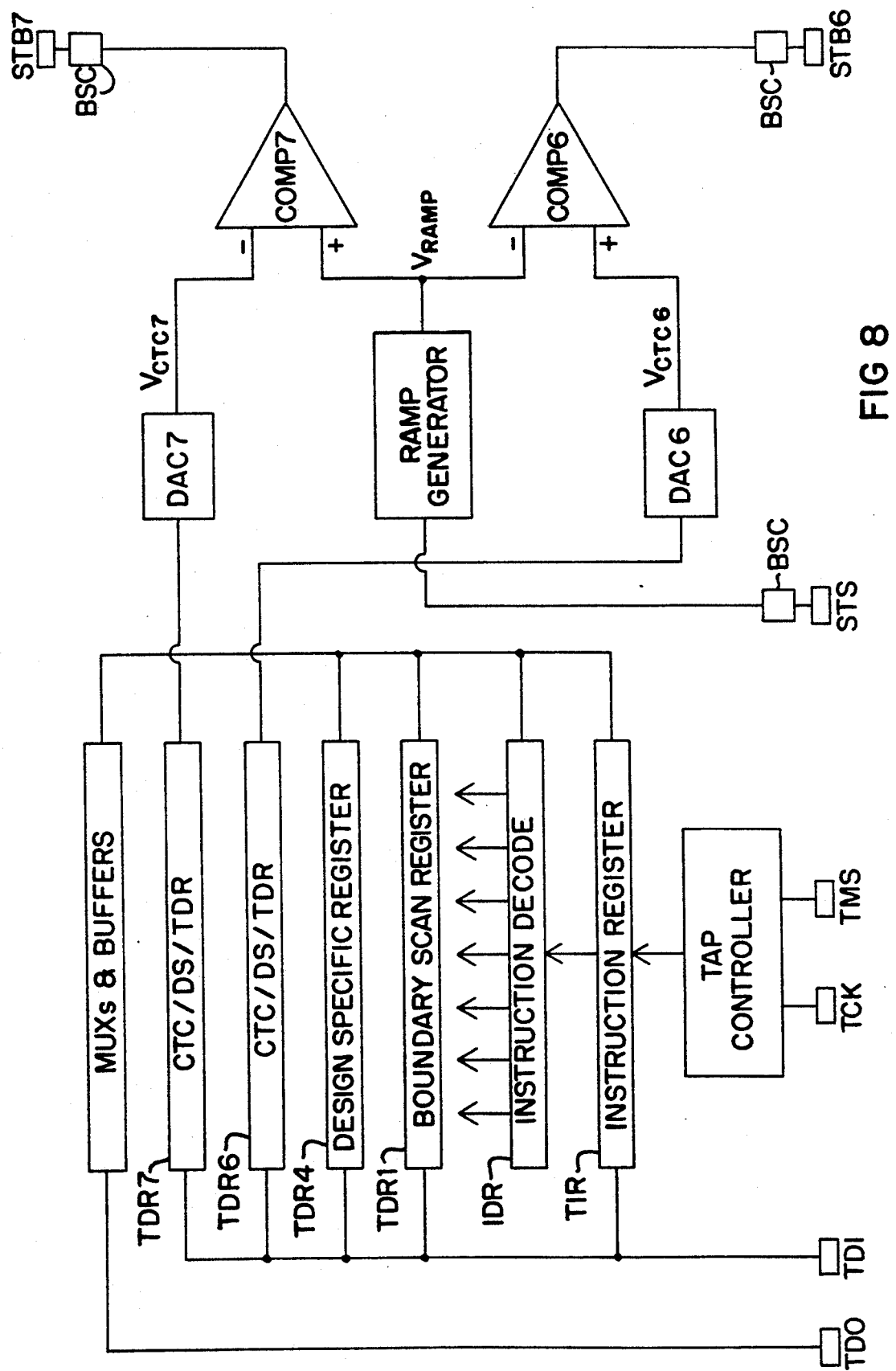
FIG. 8 is a block diagram of a programmable and controllable timing circuit according to the invention similar to FIG. 5 but showing a dual clock strobe signal timing generator circuit.

The circuit block diagram of FIG. 8 illustrates a similar ramp and comparator programmable and controllable timing circuit. In this example however the ramp generator provides a sawtooth or voltage ramp output signal $V_{RAMP}$ for two different ramp and comparator variable timing generator circuits of opposite polarity. Two different controllable timing circuit design specific TAP data registers TDR6 and TDR7 are provided for specifying different CTC binary timing codes to separate digital to analog converters DAC6 and DAC7. The outputs of the respective digital to analog converters DAC6 and DAC7 are applied at respective inputs of separate comparators COMP6 and COMP7. The other inputs of the respective comparators are provided by the ramp generator RAMP in the form of the voltage ramp output $V_{RAMP}$. The outputs of the respective comparators COMP6 and COMP7 provide separately controllable clock strobe signals STB6 and STB7 at respective output pins STB6 and STB7. Only three of the boundary scan cells BSC of the boundary scan register TDR1 are incidentally shown adjacent to the STS input pin and STB6 and STB7 output pins. The separate time intervals between the start trigger signal STS and STB6 and between STS and STB7 are separately programmed by the binary timing codes from TDR6 and TDR7.

Figure 8A:
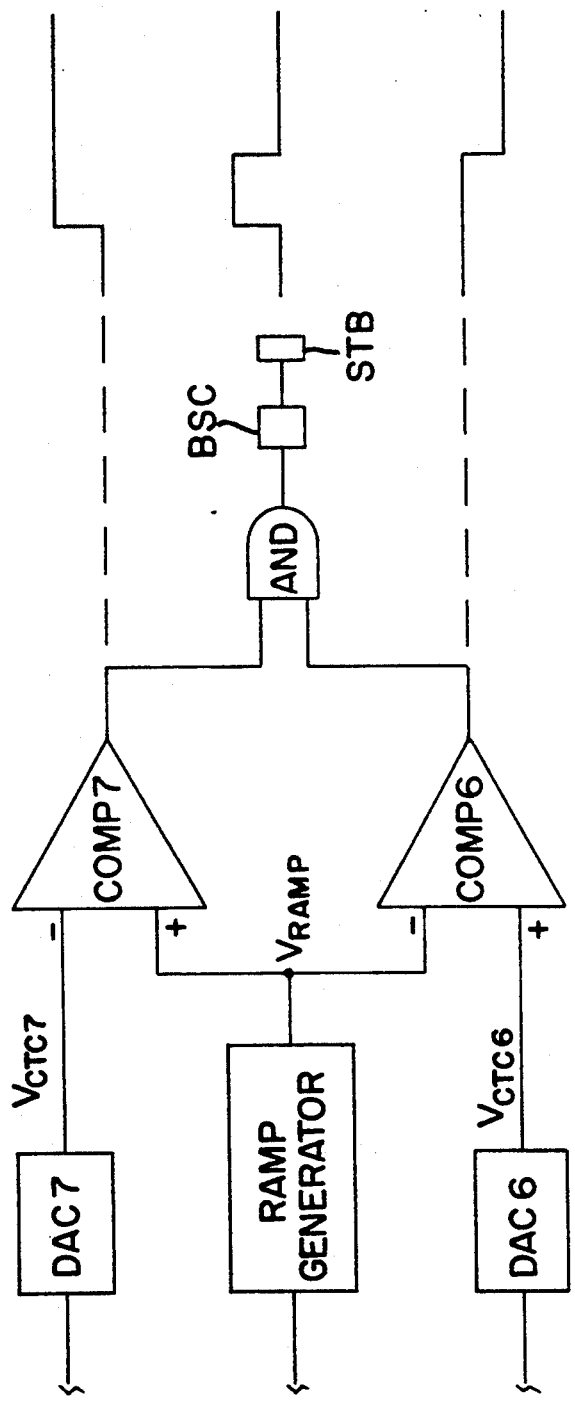
FIG. 8A is a block diagram of another programmable and controllable timing circuit for controlling the leading edge and trailing edge of a square wave pulse clock strobe signal.

According to an alternative embodiment illustrated in FIG. 8A, the outputs of comparators COMP6 and COMP7 may be coupled together through an "and" gate AND to provide a single clock strobe output STB. By this arrangement, both the rising and falling edges of the clock strobe signal STB may be controlled. For example the LH edge may be controlled and initiated when the first comparator COMP6 changes state while the HL edge is controlled by the second comparator COMP7 when the second comparator COMP7 changes state. To this end, the inputs to respective comparators COMP6, and COMP7 namely $V_{CTC6}$, $V_{CTC7}$, and $V_{RAMP}$ are coupled with opposite polarity for determining the rising and falling edges of output clock signal STB. If opposite polarity couplings are not used, then appropriate inverters may be required to deliver proper polarities to the "and" gate AND.

Further background on programmable ramp and comparator variable timing generator circuits is found in the article by Richard Feldman and David Rosky, "A Step by Step Guide to programmable Delays", *ELECTRONIC DESIGN*, Jun. 13, 1991, Pages 97–104.

Figure 9A:
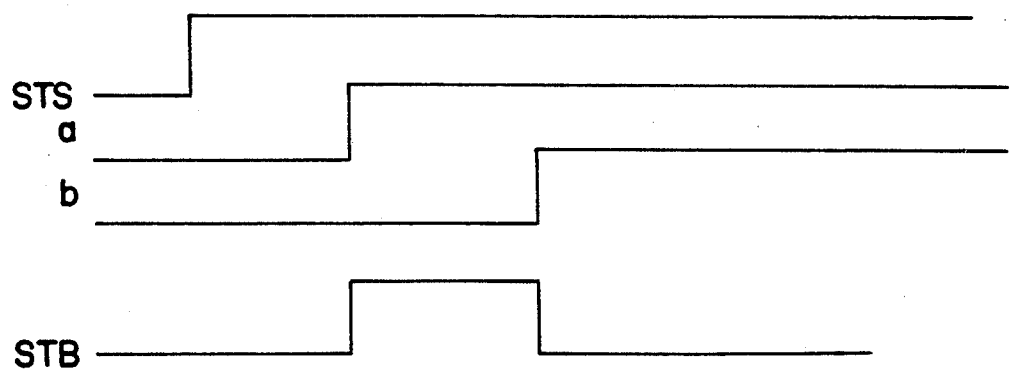
FIG. 9A is a timing diagram for operation of the circuit of FIG. 9.
Figure 9:
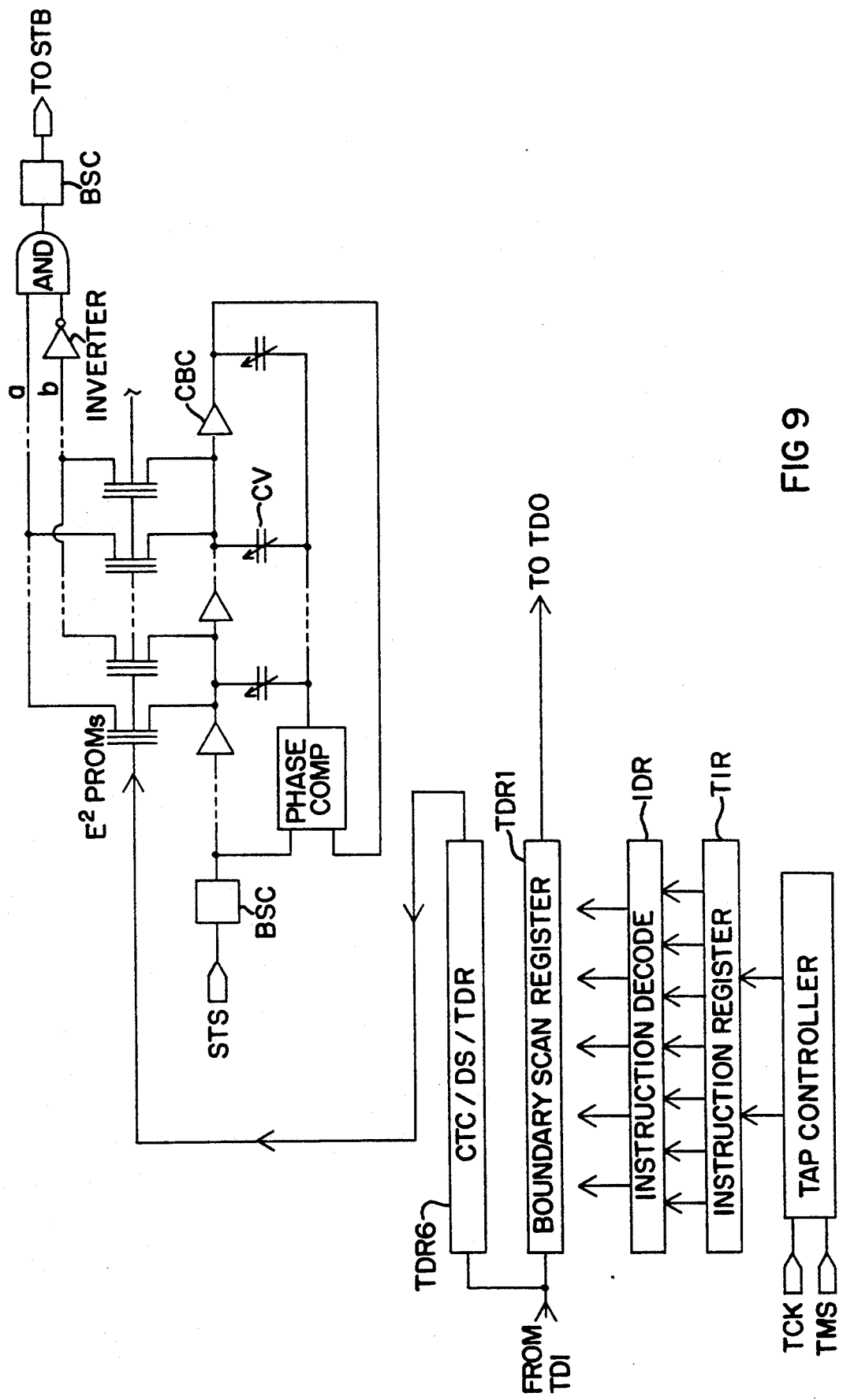
FIG. 9 is a block diagram of an alternative embodiment of the programmable and controllable timing circuit using a selectable path delay circuit in the form of a cascade of buffer circuits for the variable timing generator circuit.

An alternative embodiment of the programmable and controllable variable timing generator circuit is illustrated in FIG. 9. In this example the variable timing generator circuit is provided by a selected path or selectable path delay circuit having an input and a cascade of buffer circuits CBC coupled in sequence with respective outputs coupled to the delay circuit input in a phase lock loop through phase comparator PHASE COMP. Variable capacitors VC provide tunable subloops from the respective buffer circuit outputs. The buffer circuit outputs are also coupled in parallel through electrically erasable programmable memories E²PROMs through logic gates to the delay circuit output which delivers the clock strobe signal STB to an STB output pin a selected time delay after the initial start trigger signal STS at the delay circuit STS input pin. Only two of the boundary scan cells BSC of the boundary scan register TDR1 are shown incidentally adjacent to the respective STS input and STB output pins.

The selected delay path through the cascade of buffer circuits CBC and therefore the selected time interval is determined by the E²PROM memories which are in turn coupled to the controllable timing circuit designed specific TAP data register CTC/DS/TDR of the test access port. The CTC binary timing code in the CTC/DS/TDR again determines the selected time interval through the E²PROM memories. Operation of the cascaded buffer circuit variable timing generator circuit is reflected in the timing diagram of FIG. 9A.

As shown in FIGS. 9 and 9A, the E? PROM outputs are paired to provide output control signals a and b at respective first and second STB control outputs. One of the output control signals b is inverted through the INVERTER so that signals a and b̄ control the rising edge and falling edge respectively of a square wave output clock pulse at STB. The respective first and inverted second control outputs a,b̄ are coupled to the inputs of the AND gate. The output of the AND gate provides the STB clock pulse signal.

An example of an ECL voltage controlled ring oscillator suitable for application as the variable timing generator circuit is described in the Craig M. Davis U.S. Pat. No. 4,876,519 issued Oct. 24, 1989 for a HIGH FREQUENCY ECL VOLTAGE CONTROLLED RING OSCILLATOR. Another programmable delay line adaptable for use as a variable timing generator circuit is described in the Fischer et al. U.S. Pat. No. 5,013,944 issued May 7, 1991 for a PROGRAMMABLE DELAY LINE UTILIZING MEASURED ACTUAL DELAYS TO PROVIDE A HIGHLY ACCURATE DELAY. Further background and instruction on the use of phase locked loops for stabilizing variable timing generator circuits are set forth in the article by Mark G. Johnson and Edwin L. Hudson, "A Variable Delay Line PLL For CPU-Coprocessor Synchronization", *IEEE JOURNAL OF SOLID STATE CIRCUITS*, Volume 23, No. 5, Pages 1218–1223, October 1988; and the article by William B. Llewellyn, Michelle M. H. Wong, Gary W. Tietz, and Patrick A. Tucci, National Semiconductor Corporation, "A 33 Mb/S Data Synchronizing Phase Locked Loop Circuit", 1988 IEEE International Solid State Circuits Conference, Digest of Technical Papers, Wednesday, Feb. 17, 1988 (WAM 1.1).

Software for managing a standard test access port according to IEEE Standard 1149.1 and JTAG Version 2.0 is available from companies such as Teradyne, Hewlett Packard, and Alpine Image Systems. Teradyne provides the "victory" (Trademark) software package for "virtual in circuit testing". The "Victory" (Trademark) software may be used for loading the CTC binary timing codes into the controllable timing circuit design specific TAP data register CTC/DS/TDR.

Utilization of the variable timing generator circuit according to the invention is typically as follows. The time interval generated by the variable timing generator circuit is increased through suitable programming of the CTC digital timing codes to increase the interval between the STS and STB until a failure point is reached in a circuit controlled by the clock strobe signal STB. Similarly the timing interval is decreased until a failure point of the controlled circuit is reached. Then the timing is set between the maximum and minimum failure points of the timing interval to accommodate the tolerances of the circuit controlled by the variable timing generator circuit.

While the invention has been described with reference to particular example embodiments it is intended to cover all modifications and equivalents within the scope of the following claims.

I claim:

1. A controllable timing circuit (CTC) for an integrated circuit chip (IC) having a test access port (TAP) with TAP access pins including a TAP data input (TDI) pin, a TAP data output (TDO) pin, a TAP mode select (TMS) pin, and a TAP clock (TCK) pin, said test access port having a plurality of TAP data registers (TDRs) coupled to receive data signals at the TDI pin and to shift data signals to the TDO pin, a TAP instruction register (TIR) coupled to receive instruction codes at the TDI pin and to direct use of selected TDRs, and a TAP controller coupled to receive control signals at the TMS pin and clock signals at the TCK pin and provide control and clock signals for controlling operation of the TIR and TDRs comprising:

said TAP comprising a controllable timing circuit design specific TAP data register (CTC/DS/TDR) constructed for receiving a coded CTC digital timing code at the TDI pin;

a variable timing generator circuit responsive to the CTC digital timing code for generating a selected time interval between a start trigger signal (STS) and a clock strobe signal (STB) according to the specific CTC digital timing code;

said CTC/DS/TDR being coupled to the variable timing generator circuit for specifying a selected time interval between the start trigger signal (STS) and said clock strobe signal (STB).

2. The CTC of claim 1 comprising a non-volatile CTC timing code memory coupled to the TDI pin of the TAP, said CTC timing code memory storing at least one CTC digital timing code for entry into the CTC/DS/TDR for specifying the selected time interval for generation by the timing generator circuit.

3. The CTC of claim 2 wherein the CTC timing code memory is an off chip memory coupled at the TDI pin.

4. The CTC of claim 2 comprising a CTC control processor coupled to selected pins of the TAP for deliverying control signals and clock signals for operation of the TAP controller circuit.

5. The CTC of claim 4 wherein the CTC control processor is an off chip processor coupled to the selected pins of the TAP.

6. The CTC of claim 1 wherein the variable timing generator circuit comprises:

a ramp generator (RAMP) having a start trigger signal input for initiating a voltage ramp signal ($V_{RAMP}$) at a ramp generator output in response to said start trigger signal (STS);

a digital to analog converter (DAC) having an input coupled to the CTC/DS/TDR and an output delivering an analog CTC voltage signal ($V_{CTC}$) corresponding to the specified CTC digital timing code;

and a comparator (COMP) having first and second inputs coupled to receive and compare the respective voltage ramp signal ($V_{RAMP}$) and CTC voltage signal ($V_{CTC}$) and an output coupled to deliver said clock strobe signal (STB).

7. The CTC of claim 6 wherein the IC comprises an STS pin coupled to the STS input of the ramp generator (RAMP) for applying said start trigger signal (STS) from an off chip source to initiate the ramp voltage signal ($V_{RAMP}$) and an STB pin coupled to the output of the comparator (COMP) for delivering said clock strobe signal (STB) for off chip use a selected time interval after the start trigger signal (STS).

8. The CTC of claim 1 wherein the variable timing generator circuit comprises:

a selectable path delay circuit having a delay circuit input, a delay circuit output, and a plurality of alternative delay paths between the delay circuit input and output affording different time intervals between said start trigger signal (STS) applied at the delay circuit input and said clock strobe signal (STB) delivered at the delay circuit output; and a plurality of E²PROM memories coupled respectively in parallel between the respective delay paths and the delay circuit output, said E²PROM memories being coupled to the CTC/DS/TDR to select a respective delay path in response to said specified CTC digital timing code.

9. The CTC of claim 8 wherein the selectable path delay circuit comprises a cascade of buffer circuits coupled to the delay circuit input and having respective buffer circuit outputs defining the respective delay paths, said plurality of E²PROM memories being coupled in parallel between the buffer circuit outputs and the delay circuit output, said buffer circuit outputs being coupled in a phase locked loop to the delay circuit input for stabilizing the timing intervals of the respective delay paths.

10. The CTC of claim 9 wherein the E²PROM memories are coupled in pairs to respective first and second STB control outputs (a,b) and comprising an inverter gate coupled in the second STB control output (b) thereby providing first and inverted second STB control outputs (a,b), and an AND gate having first and second AND gate inputs coupled to the first and inverted second STB control outputs (a,b) for separately controlling the rising and falling edges respectively of said clock strobe signal (STB) at the delay circuit output, and wherein said clock strobe signal (STB) is a square wave signal.

11. A controllable timing circuit (CTC) for an integrated circuit chip (IC) having a test access port (TAP) with TAP access pins including a TAP data input (TDI) pin, a TAP data output (TDO) pin, a TAP mode select (TMS) pin, and a TAP clock (TCK) pin, said test access port having a plurality of TAP data registers (TDRs) coupled to receive data signals at the TDI pin and to shift data signals to the TDO pin, a TAP instruction register (TIR) coupled to receive instruction codes at the TDI pin and to direct use of selected TDRs, and a TAP controller coupled to receive control signals at the TMS pin and clock signals at the TCK pin and provide control and clock signals for controlling operation of the TIR and TDRs comprising:

said TAP comprising a controllable timing circuit design specific TAP data register (CTC/DS/TDR) constructed for receiving a coded CTC digital timing code at the TDI pin;

a digital to analog converter (DAC) having an input coupled to the CTC/DS/TDR and an output delivering an analog CTC voltage level signal ($V_{CTC}$) corresponding to the specific CTC digital timing code;

a ramp generator (RAMP) having a start trigger signal input for initiating a voltage ramp signal ($V_{RAMP}$) at a ramp generator output in response to a start trigger signal (STS);

a comparator (COMP) having first and second inputs coupled to receive and compare the respective voltage ramp signal ($V_{RAMP}$) and CTC voltage signal ($V_{CTC}$) and an output coupled to deliver a clock strobe signal (STB) upon substantial coincidence of the voltage ramp signal ($V_{RAMP}$) and CTC voltage signal ($V_{CTC}$) thereby generating a selected time interval between the start trigger signal (STS) and clock strobe signal (STB) according to the specified CTC digital timing code from the CTC/DS/TDR;

said IC having an STS pin coupled to the start trigger signal input of the ramp generator (RAMP) for applying said start trigger signal (STS) from an off chip source to initiate the ramp voltage signal ($V_{RAMP}$) and an STB pin coupled to the output of the comparator (COMP) for delivering said clock strobe signal (STB) said selected time interval after the start trigger signal (STS);

and an off chip non-volatile CTC timing code memory coupled to the TDI pin of the TAP, said CTC timing code memory storing at least one CTC digital timing code for entry into the CTC/DS/TDR for specifying a selected time interval.

12. The CTC of claim 11 comprising:

first and second CTC/DS/TDRs (TDR6,TDR7);

first and second DACs (DAC6, DAC7) coupled to the respective first and second CTC/DS/TDRs (TDR6,TDR7) and providing first and second analog CTC voltage level signals ($V_{CTC6}$, $V_{CTC7}$);

first and second comparators (COMP6, COMP7), said first and second analog CTC voltage level signals ($V_{CTC6}$, $V_{CTC7}$) and voltage ramp signal ($V_{RAMP}$) being coupled to the respective first and second comparators (COMP6, COMP7) with opposite polarity;

an AND gate having first and second AND gate inputs coupled to respective outputs of the first and second comparators (COMP6, COMP7), said AND gate having an output coupled to the STB pin for providing said clock strobe signal (STB) having rising and falling edges separately controlled by the respective first and second CTC/DS/TDRs (TDR6, TDR7, and wherein said clock strobe signal is a square wave pulse.

13. A method of controlling and programming the timing of a controllable timing circuit (CTC) on an integrated circuit chip (IC) having a test access port (TAP) with TAP access pins including a TAP data input (TDI) pin for receiving data signals and instruction codes, a TAP data output (TDO) pin for shifting out data signals and instruction codes, a TAP mode select (TMS) for receiving control signals, and a TAP clock (TCK) pin for receiving clock signals, said test access port having a plurality of TAP data registers (TDRs) coupled to receive data signals at the TDI pin and to shift data signals to the TDO pin, a TAP instruction register (TIR) coupled to receive instruction codes at the TDI pin and to direct use of selected TDRs, and a TAP controller coupled to receive control signals at the TMS pin and clock signals at the TCK pin and provide control signals and clock signals for controlling operation of the TIR and TDRs comprising:

constructing the test access port with a controllable timing circuit design specific tap data register (CTC/DS/TDR) coupled to the TDI pin for receiving data signals in the form of a CTC digital timing code;

providing on the IC a variable timing generator circuit responsive to a CTC digital timing code for generating a selected time interval between a start trigger signal (STS) and a clock strobe signal (STB) according to the specified CTC digital timing code, and coupling said variable timing generator circuit to the CTC/DS/TDR;

operating the TAP controller to direct loading into the TAP instruction register (TIR) of a CTC instruction code which directs operation of the CTC/DS/TDR;

selecting the CTC/DS/TDR in response to the CTC instruction code, loading a specified CTC digital timing code in the CTC/DS/TDR from the TDI pin, and shifting the CTC digital timing code to the variable timing generator circuit; and generating a selected time interval between said start trigger signal (STS) and said clock strobe signal (STB) in response to the specified CTC digital timing code.

14. The method of claim 13 comprising the step of providing an off chip CTC control processor coupled to selected TAP pins, delivering control signals and clocks signals for operation of the TAP controller, and loading the CTC instruction code in the TIR in response to control and clock signals from the TAP controller.

15. The method of claim 13 comprising the step of providing an off chip non-volatile CTC data memory coupled to the TDI pin, storing at least one CTC digital timing code in the CTC data memory, and loading a CTC digital timing code into the CTC/DS/TDR from the CTC data memory in response to the CTC instruction code.

16. The method of claim 13 wherein the variable timing generator circuit comprises a ramp generator (RAMP) having a start trigger signal input for initiating a voltage ramp signal ($V_{RAMP}$) at a ramp generator output in response to said start trigger signal at the start trigger signal input, a digital to analog converter (DAC) having an input coupled to the CTC/DS/TDR and an output delivering an analog CTC voltage signal ($V_{CTC}$) corresponding to the specified CTC digital timing code, and a comparator (COMP) having first and second inputs coupled to receive and compare the respective voltage ramp signal ($V_{RAMP}$) and CTC voltage signal ($V_{CTC}$) and an output delivering said clock strobe signal (STB) upon substantial coincidence of the voltage levels of $V_{RAMP}$ and $V_{CTC}$, and comprising the further steps of:

applying said start trigger signal (STS) at the start trigger signal input of the ramp generator (RAMP); and delivering said clock strobe signal (STB) a selected time interval after the start trigger signal (STS) according to the specified CTC digital timing code in the CTC/DS/TDR.

17. The method of claim 16 wherein the integrated circuit chip (IC) comprises an STS pin and an STB pin and comprising the steps of:

applying said start trigger signal (STS) at the STS from an off chip source pin;

and delivering said clock strobe signal (STB) at the STB pin for off chip use.

18. The method of claim 13 wherein the variable timing generator circuit comprises a selectable path delay circuit having a delay circuit input, a delay circuit output, and a plurality of alternative delay paths coupled between the delay circuit input and output affording different time intervals between said start trigger signal (STS) applied at the delay circuit input and said clock strobe signal (STB) delivered at the delay circuit output, a plurality of E$^2$PROM memories coupled between the respective delay paths and the delay circuit output, said E$^2$PROM memories being coupled to the CTC/DS/TDR to select a respective delay path in response to said specified CTC digital timing code, and comprising the further steps of:

applying said start trigger signal (STS) at the delay circuit input;

selecting a delay path using the E$^2$PROMs in response to said specified CTC digital timing code;

and delivering said clock strobe signal (STB) at the delay circuit output a selected time interval after the start trigger signal (STS).

19. The method of claim 18 wherein the selectable path delay circuit comprises a cascade of buffer circuits having respective buffer circuit outputs, and wherein the E$^2$PROM memories are coupled in parallel between the buffer circuit outputs and the delay circuit output.

20. The method of claim 18 wherein the IC is formed with an STS pin and an STB pin and wherein the step of applying said start trigger signal (STS) at the delay circuit input comprises deriving the start trigger signal (STS) from an off chip source coupled to the STS pin, deriving the CTC digital timing code from a second off chip source coupled to the TDI pin, and delivering the clock strobe signal at the STB pin for off chip applications.

* * * * *